(12) United States Patent
Heightley et al.

(10) Patent No.: US 6,741,488 B1
(45) Date of Patent: May 25, 2004

(54) MULTI-BANK MEMORY ARRAY ARCHITECTURE UTILIZING TOPOLOGICALLY NON-UNIFORM BLOCKS OF SUB-ARRAYS AND INPUT/OUTPUT ASSIGNMENTS IN AN INTEGRATED CIRCUIT MEMORY DEVICE

(75) Inventors: John Heightley, Colorado Springs, CO (US); Jon Allan Faue, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/299,738

(22) Filed: Nov. 19, 2002

(51) Int. Cl.$^7$ ................................................ G11C 5/06
(52) U.S. Cl. .................................... 365/63; 365/230.03
(58) Field of Search .................... 365/63, 51, 230.03

(56) References Cited

U.S. PATENT DOCUMENTS

| | | | |
|---|---|---|---|
| 6,173,356 B1 * | 1/2001 | Rao | 711/5 |
| 6,256,256 B1 * | 7/2001 | Rao | 365/230.05 |
| 6,504,785 B1 * | 1/2003 | Rao | 365/230.05 |

OTHER PUBLICATIONS

Weiss, Don, Wuu, John J., Chin, Victor, 6.7 The On–chip 3MB Subarray Based $3^{rd}$ Level Cache on Itanium Microprocessor, systems & visi technology operation ia–64 references, Hewlett–Packard Company, Fort Collins, CO and Intel Corp., Santa Clara, CA, http://cpus.hp.com/technical_references/isscc_2002/isscc_2002_5.shtml; Sep. 26, 2002, pp. 1–10.

Weiss, Don, Wuu, John J., Chin, Victor, The On–chip 3MB Subarray Based $3^{rd}$ Level Cache on an Itanium™ Microprocessor, Hewlett–Packard Company, Fort Collins, CO and Intel Corp., Santa Clara, CA, pp. 1–18.

* cited by examiner

Primary Examiner—Thong Q. Le
(74) Attorney, Agent, or Firm—William J. Kubida; Peter J. Meza; Hogan & Hartson LLP

(57) ABSTRACT

A multi-bank memory array architecture utilizing topologically non-uniform blocks of sub-arrays and input/output ("I/O") assignments in an integrated circuit memory device. By using non-uniform blocks of multiple identical sub-arrays, non-uniform assignments of blocks to banks and/or non-uniform assignments of I/Os to blocks, it is possible to optimize the dimensions of the chip and the placement of the I/Os with respect to the package pads. In this manner, the granularity of the building blocks of sub-arrays is improved while the flexibility in I/O assignment is also improved leading to more efficient and flexible chip layouts.

22 Claims, 6 Drawing Sheets

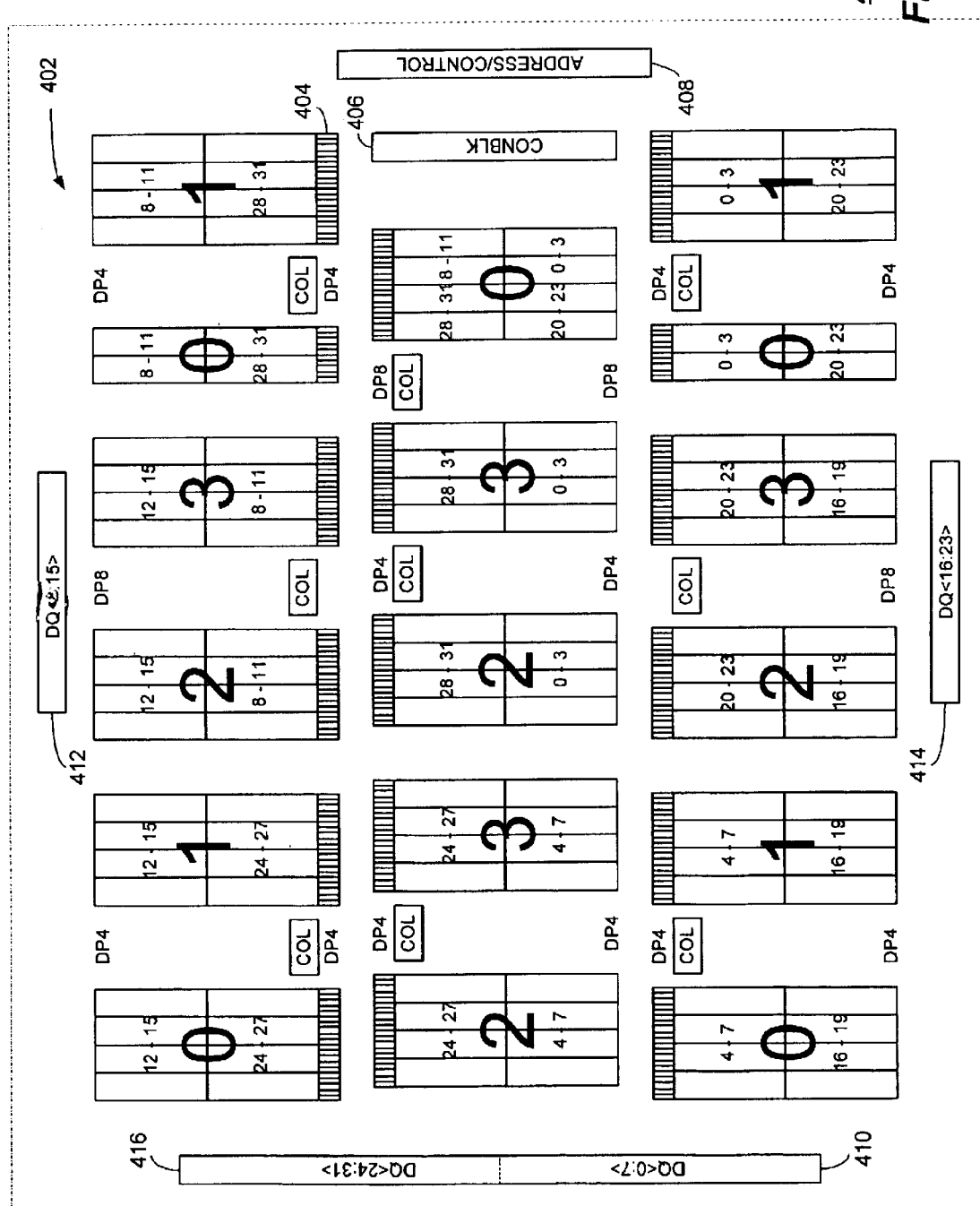

US 6,741,488 B1

MULTI-BANK MEMORY ARRAY ARCHITECTURE UTILIZING TOPOLOGICALLY NON-UNIFORM BLOCKS OF SUB-ARRAYS AND INPUT/OUTPUT ASSIGNMENTS IN AN INTEGRATED CIRCUIT MEMORY DEVICE

BACKGROUND OF THE INVENTION

The present invention relates, in general, to the field of integrated circuit devices incorporating semiconductor memory components such as static random access memory ("SRAM"), dynamic random access memory ("DRAM"), electrically programmable read only memory ("EPROM"), ferroelectric random access memory ("FRAM"), Flash memory and the like. More particularly, the present invention relates to a multi-bank memory array architecture utilizing topologically non-uniform blocks of sub-arrays and input/output ("I/O") assignments in an integrated circuit memory device.

Many types of relative large, commodity memory devices are currently available including those types listed above. Regardless of configuration, the primary purpose of the memory device is to store data. Functionally, data may be written to the memory, read from it and, in the case of dynamic random access memory, periodically refreshed to maintain the integrity of the stored data. Each cell of a memory array serves to store a value or charge representative of either a logic level "1" or "0".

In the design of semiconductor memories, the memory cells are typically arranged into sub-arrays with row select circuitry on one side of the sub-arrays and data sensing circuitry on the two sides orthogonal to the row select circuitry. The overall memory is, in turn, built up into multiple banks of multiple sub-arrays in a uniform arrangement. However, such an arrangement serves to constrain the overall integrated circuit chip to then be of certain dimensions in the "X" and "Y" directions as determined by the size of the sub-arrays and the uniform arrangement of the sub-arrays into memory banks. While these constraints may not necessarily present a problem, there are instances where, for a given technology and package definition, they can present a problem.

A presentation and paper given at the 2002 International Solid State Circuits Conference ("ISSCC") entitled: "The On-Chip 3 MB Subarray Based $3^{rd}$ Level Cache on an Itanium™ Microprocessor" by Don Weiss, John J. Wuu and Victor Chin describes a technique for utilizing multiple memory sub-arrays to build up the SRAM cache memory in a microprocessor through the use of a non-uniform sub-array placement. The so-called sub-arrays therein contemplated are specially designed, complete and relatively small SRAMs and each "sub-array" is dedicated to specific memory output bits, e.g. bits 0–7, with all of those specific bits (0–7) stored in the same "sub-array".

In contrast, with large commodity memory devices, it is simply not practical to have a single sub-array store all occurrences of specific memory output bits. In these types of devices, multiple sub-arrays are required. The design presented in the foregoing ISSCC description is intended for embedded microprocessor memory and is decidedly not a multi-bank design for use in packaged memory products with the associated size and pad placement constraints such designs impose.

SUMMARY OF THE INVENTION

Disclosed herein is a multi-bank memory array architecture utilizing topologically non-uniform blocks of sub-arrays and I/O assignments. By using non-uniform blocks of multiple identical sub-arrays, non-uniform assignments of blocks to banks and/or non-uniform assignments of I/Os to blocks, it is possible to optimize the dimensions of the chip and the placement of the I/Os with respect to the package pads. In this manner, the granularity of the building blocks comprising multiple sub-arrays is improved while the flexibility in I/O assignment is also improved leading to more efficient and flexible chip layouts.

Particularly disclosed herein is an integrated circuit memory device which comprises a memory array having at least one memory bank. The memory bank, in turn, comprises a plurality of blocks of sub-arrays wherein at least one of the plurality of blocks of sub-arrays is topologically non-uniform with respect to others of the blocks.

Further disclosed herein is a method for organizing a memory array layout in an integrated circuit device. The method comprises: partitioning the memory array into a plurality of blocks of sub-arrays with at least one of the blocks being topologically non-uniform with respect to others and arranging the plurality of blocks of sub-arrays such that data bit locations assigned to respective ones of the blocks of sub-arrays are substantially proximate to corresponding input/output lines of the memory array.

Still further disclosed herein is an integrated circuit memory device comprising an array of memory cells formed into a plurality of memory banks. The memory device comprises at least one memory bank, with the memory bank further comprising a block of sub-arrays of the memory cells having a first on-chip area. At least one other memory bank comprises two or more additional blocks of sub-arrays of the memory cells, with each of the additional blocks of sub-arrays having a lesser on-chip area than the first on-chip area.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 4A is a more detailed block diagram of a particular implementation of an integrated circuit memory device in accordance with the present invention for use, for example, in the implementation of an 8M×32 (256 MB) device.

DESCRIPTION OF A REPRESENTATIVE EMBODIMENT

Figure 1:
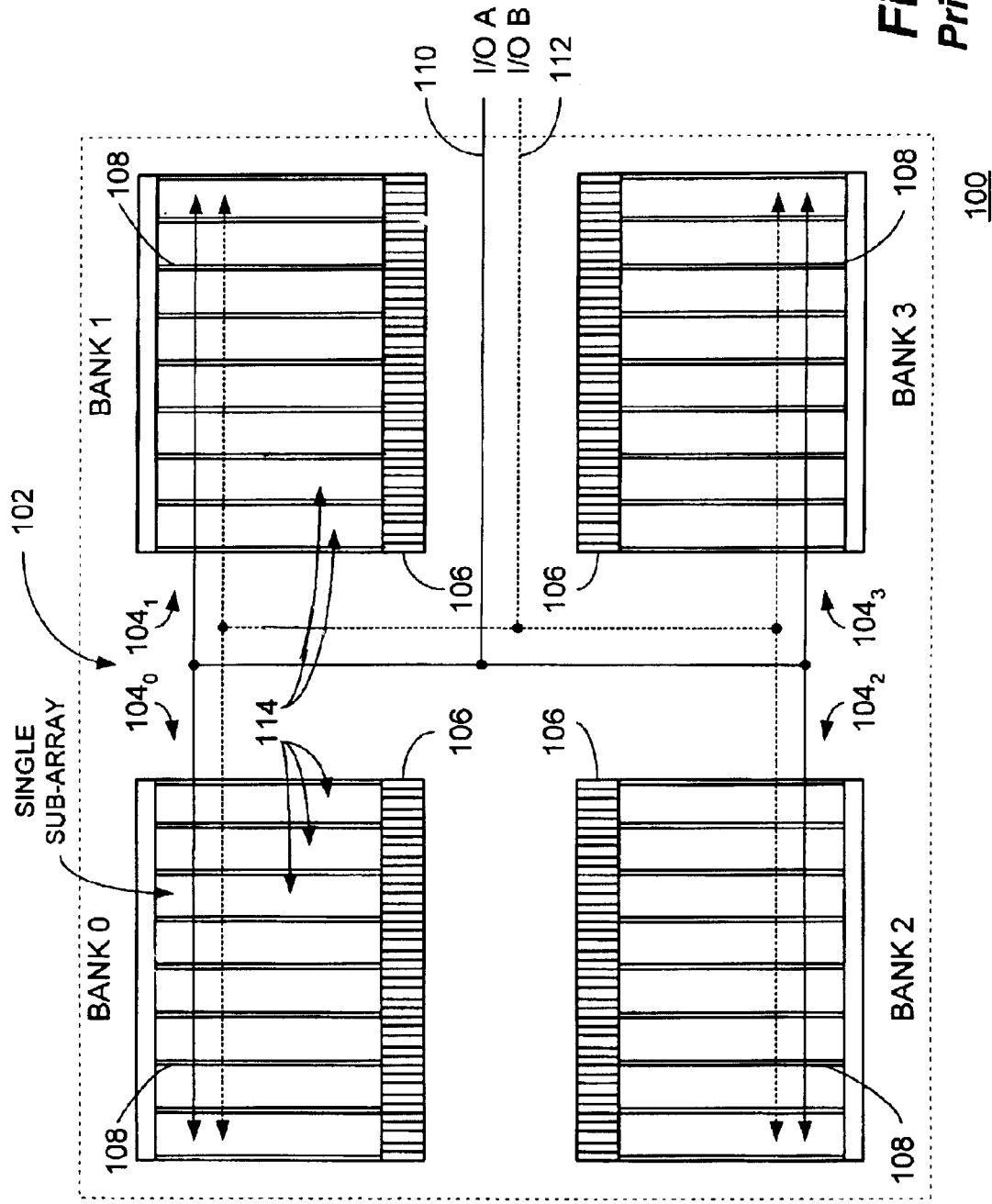
FIG. 1 is a simplified block diagram e a conventional integrated circuit memory device including a memory array comprising four topologically uniform banks of memory cells arranged in uniform sub-arrays and indicating how a representative pair of I/Os must be routed to all four banks.

With reference now to FIG. 1, a simplified block diagram of a conventional prior art integrated circuit memory device 100 is shown. The memory device 100 includes a memory array 102 comprising four uniform banks $104_0$ through $104_3$ of memory cells arranged in uniform sub-arrays 114. Each of the banks 104 include associated row select circuitry 106 and oppositely disposed data sensing circuitry 108 for accessing the sub-arrays thereof. As illustrated, a pair of data input/output ("I/O") lines (or "DQ") 110 and 112 are shown and each line (or groups of lines) must be routed to all of the banks 104 in the memory array 102. Note that the entire row and column address fields are associated with each bank 104.

Stated another way, in the design of conventional semiconductor memory devices 100, the memory cells are arranged in uniform groupings with the row select circuitry 106 on one side of the sub-arrays and the data sensing circuitry 108 on the two sides orthogonal to the row select circuitry 106. The overall memory device 100 is, in turn, built up into multiple banks 104 of multiple sub-arrays in a uniform arrangement as shown with each bank $104_0$ through $104_3$ of the memory array 102 being identical to each of the other banks 104.

Figure 2:
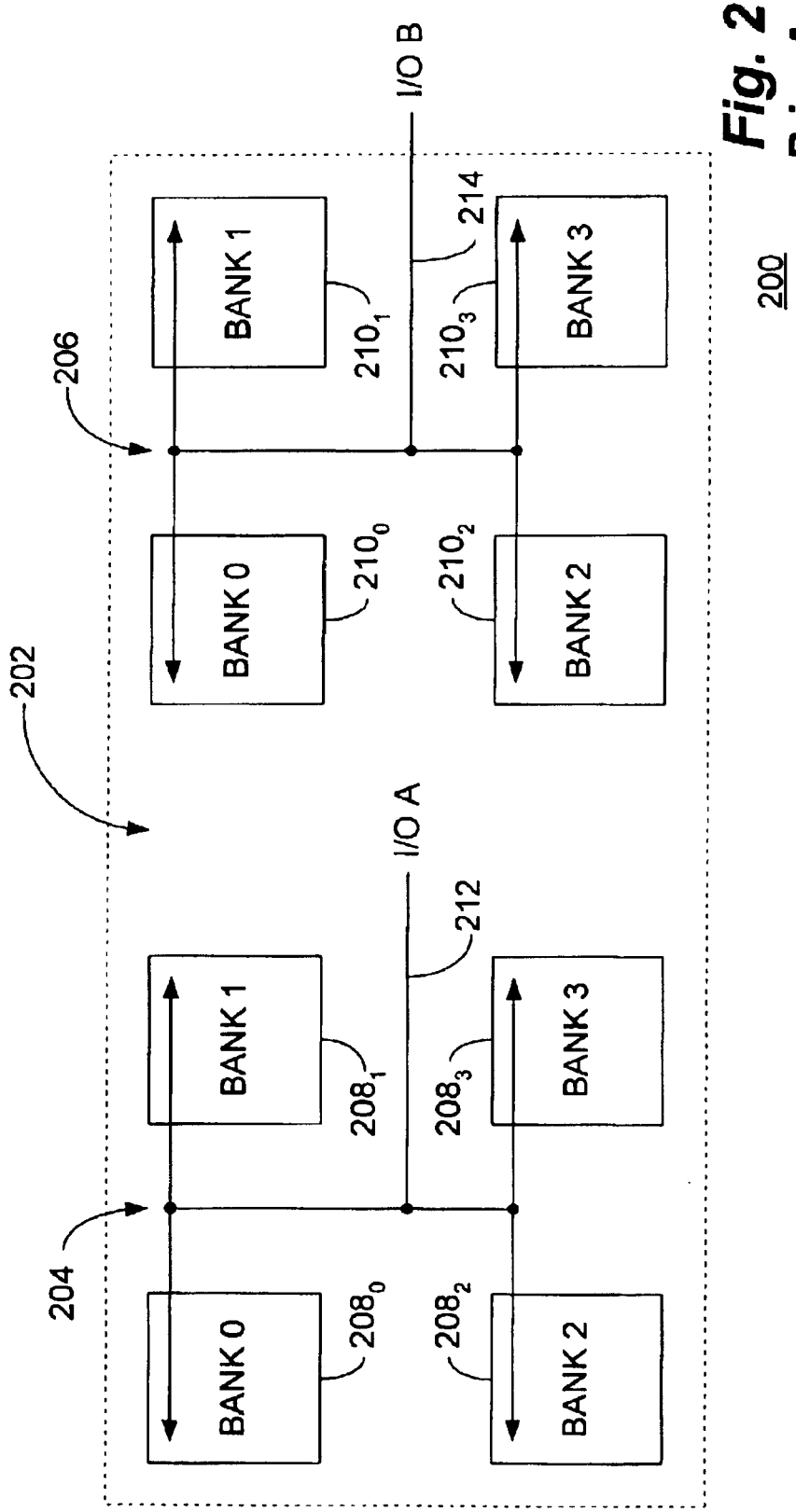
FIG. 2 is a further simplified block diagram of a conventional integrated circuit memory device including a memory array made up of two separate sub-groups of four uniform half-banks of memory cells and further indicating how each of a representative pair of I/Os may be routed to all of the memory half-banks in each of the sub-groups.

With reference additionally now to FIG. 2, a further simplified block diagram of another conventional prior art implementation of a memory device 200 is shown. The memory device 200 includes a memory array 202. The individual banks 0–3 are sub-divided into two uniform groups of blocks of sub-arrays 204, 206. Each group includes one-half of banks 0–3 ($208_0$–$208_3$ in group 204 and $210_0$–$210_3$ in group 206). In the case of this implementation, the sub-division is done on the basis of the I/Os. That is, one group 204 is associated with I/O A 212 and the group 206 is associated with the I/O B 214. Further, the two sub-divisions are equal in the arrangement of the half-banks and the sub-arrays within the half-banks and in the silicon area that will be occupied by the two sub-divisions. In the prior art, any sub-division of the banks is always uniform and the specific I/Os are dedicated to specific sub-divisions of the banks. The entire row address field is associated with each half-bank in each sub-group.

This prior art arrangement shown in FIGS. 1 and 2 constrain the overall integrated circuit chip to be of certain dimensions in the X and Y directions determined by the size of the sub-arrays and the uniform arrangement of the sub-arrays into banks 104 or half-banks 208, 210 respectively. This constraint is normally not a problem, but for a given technology and package definition, it can become so given the size of the device and the design rules employed.

In a conventional multi bank memory device 100 (FIG. 1) or 200 (FIG. 2), the overall memory array is created by assembling multiple, uniform sub-arrays into uniform blocks by placing the sub-arrays side-by-side in a contiguous array. The sub-arrays within each block may all be assigned to a single bank or to multiple banks, but the format and physical dimensions of all the blocks are identical. Further, the distribution of the I/O assignments across the blocks is uniform, that is, there are the same number of blocks accessed for each I/O.

Figure 3:
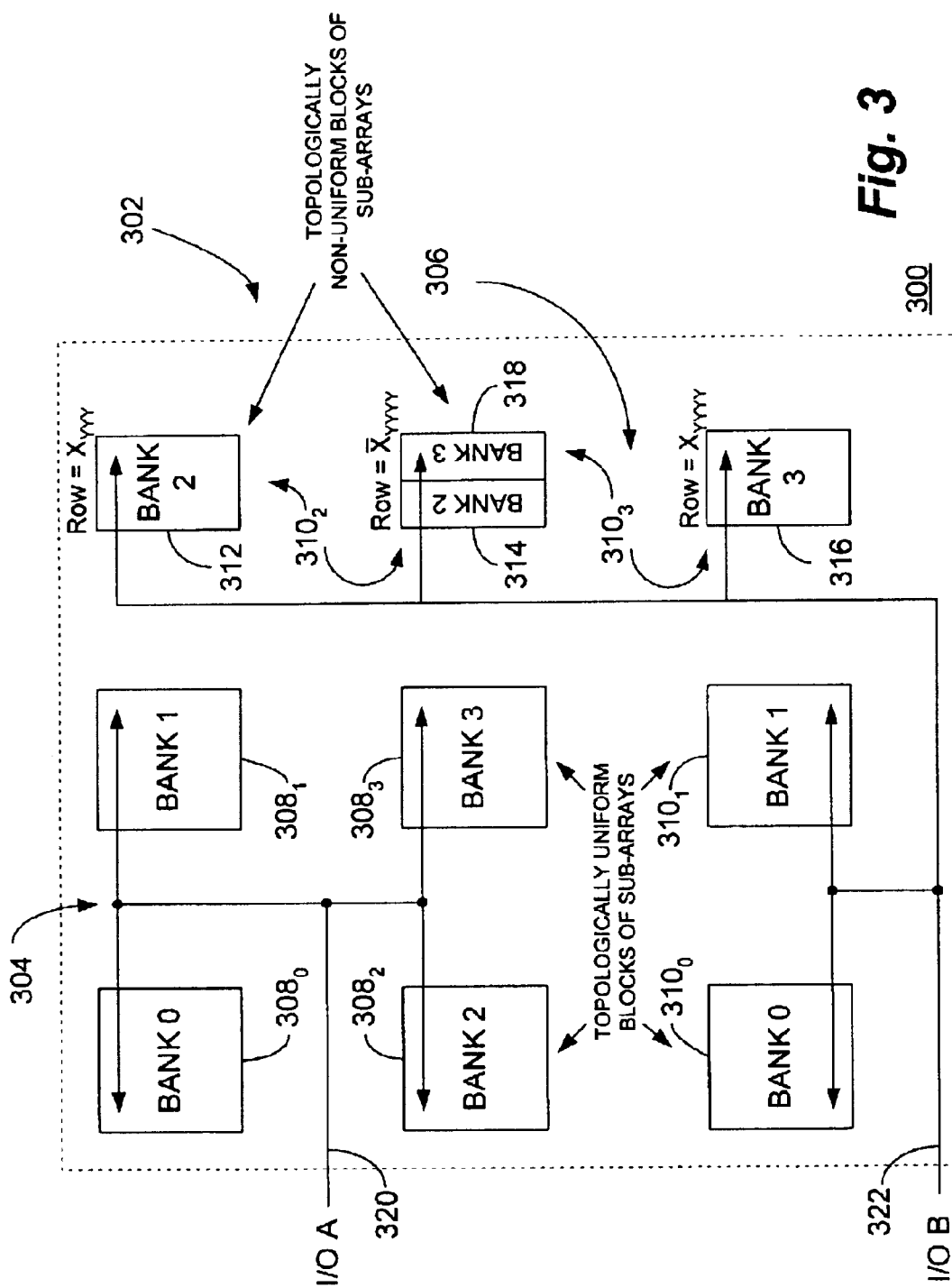
FIG. 3 is a comparative block diagram of a representative integrated circuit memory device in accordance with the present invention wherein the architecture utilizes, with respect to at least one of the groups of memory banks, one or more topologically non-uniform blocks of sub-arrays and I/O assignments.

With reference additionally now to FIG. 3, a comparative block diagram of a representative integrated circuit memory device 300 in accordance with the present invention. The illustrative memory device 300 shown includes a memory array 302 comprising a pair of sub-groups 304 and 306, where each sub-group represents one-half of banks 0–3. As shown, the sub-group 304 may be of a conventional design wherein each of the memory half-banks $308_0$ through $308_3$ are topologically uniform in configuration and include conventional I/O mapping.

As also shown, the sub-group 306 includes four memory half-banks $310_0$ through $310_3$ of which $310_0$ and $310_1$ are uniform in the same manner as memory half-banks $308_0$ through $308_3$ of group 304 which are accessed by I/O A line 320. In accordance with the present invention however, at least one of the memory banks (in the illustrative embodiment shown, two memory banks) $310_2$ and $310_3$ is configured into topologically non-uniform blocks of sub-arrays with the former being formed into two sub-array blocks 312 and 314 while the latter is formed into two sub-array blocks 316 and 318. The row address field of bank 2 and bank 3 are split between two sub-array blocks in contrast to the prior art in which the full row address filed is associated with all blocks of sub-arrays. In this manner, the I/Os to the sub-arrays of group 306 may be advantageously arranged to access particular portions of certain of the banks $310_2$ and $310_3$ through I/O B line 322.

In accordance with the technique of the present invention, a given I/O line (or group of I/O lines) on the integrated circuit chip has, or could have, a bank/sub-array block arrangement different than that of the other I/O lines. As illustrated, I/O A line 320 may access the four banks $308_0$ through $308_3$ in a conventional "matched" situation while I/O B line 322 may be routed to its four bank $310_0$ through $310_3$ addresses by actually accessing five (or more) topologically non-uniform block destinations. For banks 2 and 3 ($310_2$, $310_3$), depending upon the row address, the routing of I/O B line 322 for bank 2 ($310_2$) may be to either sub-array block 312 or the sub-array block 314 of bank 2. Similarly, access to bank 3 ($310_3$), may be to the sub-array block 318 or sub-array block 316. In a representative implementation of the present invention, the highest order row address may be used to determine which part of the two blocks 312, 314/316, 318 of $310_2$ or $310_3$ respectively should be accessed.

For a given I/O line 322 within a bank, its particular path is defined when the row address is latched. Only the path of interest is enabled for the selected bank 310 and the other path for the same bank is not enabled. By not requiring all the banks 310 to be of equal block configuration and have equal I/O mapping, the integrated circuit die aspect ratio can be adjusted to fit any package size.

With reference additionally now to FIG. 4A, a more detailed block diagram of a particular implementation of an integrated circuit memory device 400 in accordance with the present invention for use, for example, in the implementation of an 8M×32 (256 MB) device using 0.14 μm design rules. The exemplary memory device 400 comprises, in pertinent part, a memory array 402 including four banks of memory cells denominated "0", "1", "2" and "3" comprising a number of topologically non-uniformly placed blocks of sub-arrays and wherein the data bit assignment numbers are indicated in the various sub-array blocks. For example, the upper leftmost block of sub-arrays of bank "0" includes data bit numbers 12–15 and 24–27 out of 32. Each of the blocks of sub-arrays of each of the banks "0", "1", "2" and "3" includes associated row select circuitry 404 and data sense circuitry (not shown).

The memory device 400 further comprises a control block ("CONBLK") 406 and an address/control block 408. The I/O lines to the various sub-arrays of the banks "0", "1", "2" and "3" are grouped into a number of regions, one of which is denominated DQ<0:7> 410, adjoining the lower left edge of the memory array 402. DQ<8:15> 412 adjoins the upper edge while DQ<16:23> 414 is at the opposite lower edge. The I/O lines denominated DQ<24:31> 416 adjoin the upper left edge of the memory array 402.

Figure 4B:
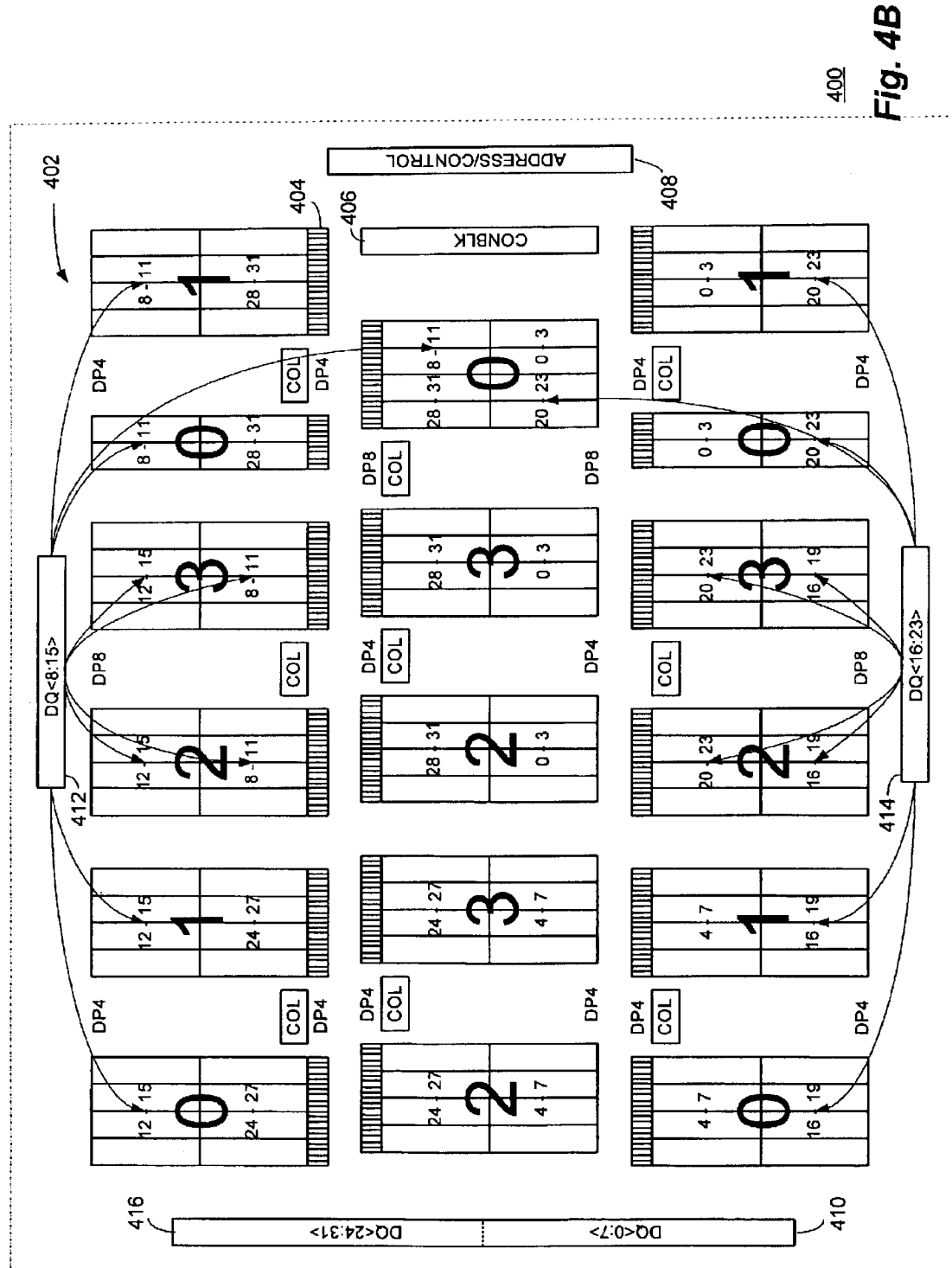
FIGS. 4B and 4C illustrate in greater detail the I/O assignment scheme for the particular implementation of a memory device in accordance with the representative embodiment of the present invention shown in the preceding figure.
Figure 4C:
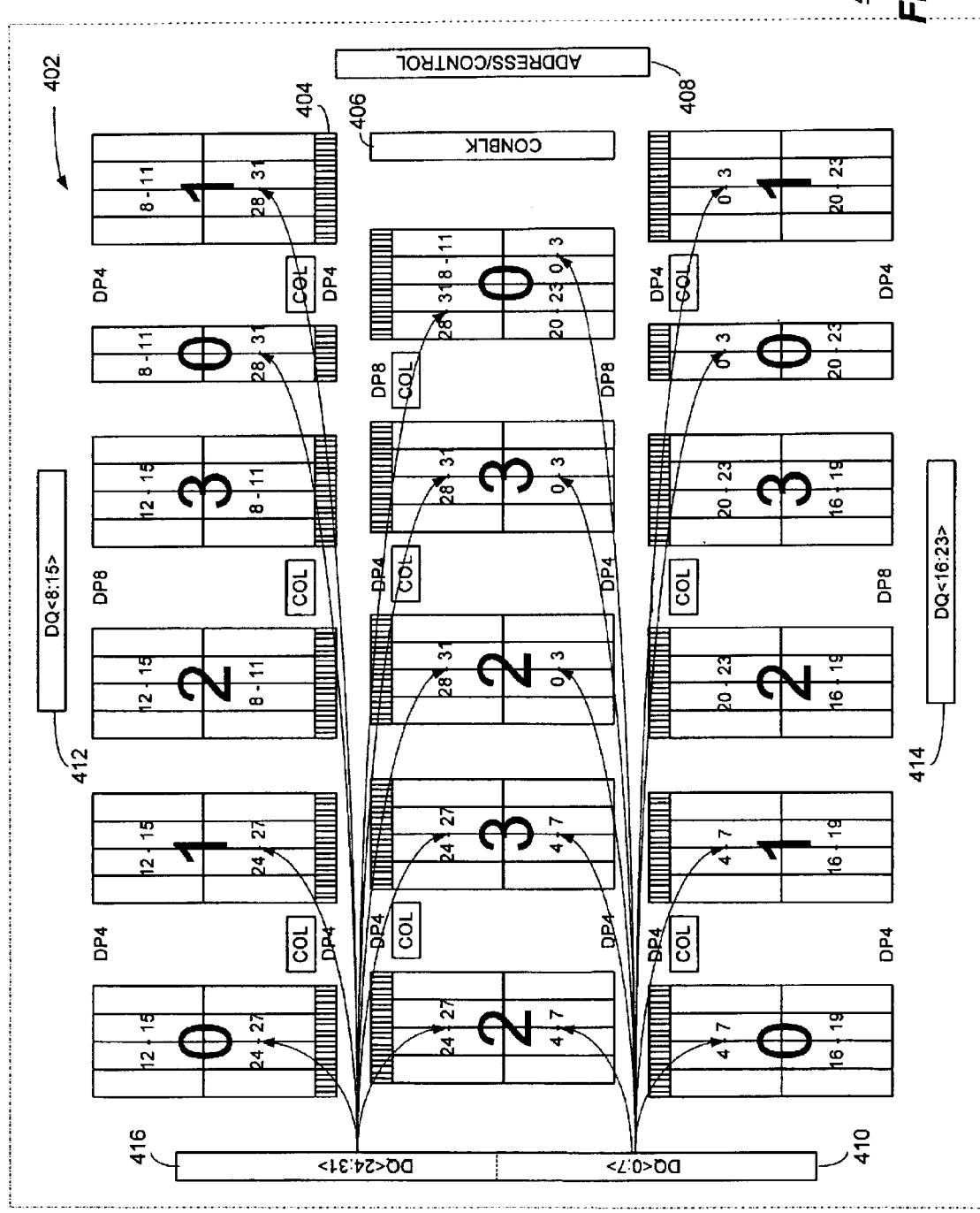

With reference additionally now to FIGS. 4B and 4C illustrate in greater detail the I/O assignment scheme for the particular implementation of a memory device 400 in accordance with the representative embodiment of present invention shown in the preceding figure. Corresponding structure to that illustrated in the preceding FIG. 4A is like numbered and the foregoing description thereof shall suffice herefor.

In these figures, the arrangement of the blocks of sub-arrays for the banks "0", "1", "2" and "3" are grouped in accordance with the method of the present invention. In particular, bank "0" has been arranged into five topologically non-uniform blocks of sub-arrays as shown. Further, it can be seen that the banks "1", "2" and "3", while comprising topologically uniform blocks of sub-arrays, are nevertheless arranged in a topologically non-uniform fashion in order to also optimize placement of the I/O lines. In particular, the I/O lines have now been more effectively routed to the various blocks of sub-arrays as illustrated with the blocks containing the sub-arrays comprising data bit numbers 0–7 being advantageously positioned for access through DQ<0:7> region 410; the data bit numbers 8–17 being advantageously positioned for access through DQ<8:15> region 412; the data bit numbers 16–23 being advantageously positioned for access through DQ<16:23> region 414 and the data bit numbers 24–31 being advantageously positioned for access through DQ<24:31> region 416. As indicated, each of the I/O lines access two blocks of the sub-arrays of banks "1", "2" and "3" but three blocks of the sub-arrays of bank "0". Thus, unlike in conventional devices, the distribution of the I/O assignments across the blocks is non-uniform in that a differing number of blocks are actually accessed.

In accordance with the method of the present invention, by not constraining all blocks of sub-arrays to be the same and by building the banks up out of non-uniform and non-contiguous assemblies, or blocks, of sub-arrays, the X and Y dimensions of the chip can be effectively optimized to meet package constraints for the memory device 400 without undue integrated circuit die size change or performance penalties.

While there have been described above the principles of the present invention in conjunction with specific memory device types and architectures, it is to be clearly understood that the foregoing description is made only by way of example and not as a limitation to the scope of the invention.

Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit memory device comprising:
   a memory ray comprising at least one memory bank, said at least one memory bank comprising a plurality of blocks of sub-arrays and wherein at least one of said plurality of blocks of sub-arrays is topologically non-uniform with respect to others of said plurality of blocks of sub-arrays.

2. The integrated circuit memory device of claim 1 wherein said at least one of said plurality of blocks of sub-arrays is of lesser topological area than said others of said plurality of blocks.

3. The integrated circuit memory device of claim 1 further comprising:
   an input/output line associated with each data bit number designated for a block of sub-arrays of said memory array.

4. The integrated circuit memory device of claim 3 wherein said input/output lines are assigned in a topologically non-uniform arrangement of blocks of sub-arrays with respect to said memory array.

5. The integrated circuit memory device of claim 3 wherein a subset of said input/output lines access a first number of said plurality of blocks of said sub-arrays and at least one other of said input/output lines access a second differing number of said plurality of blocks of said sub-arrays.

6. The integrated circuit memory device of claim 5 wherein said first number of said plurality of blocks of said sub-arrays is an even number and said second differing number of said plurality of blocks of said sub-arrays is an odd number.

7. The integrated circuit memory device of claim 1 wherein said at least one of said plurality of blocks of sub-arrays represents a portion of said at least one memory bank.

8. The integrated circuit memory device of claim 1 wherein said at least one of said plurality of blocks of sub-arrays represents a portion of said at least one memory bank and a portion of another memory bank.

9. The integrated circuit memory device of claim 1 wherein said memory array comprises dynamic random access memory cells.

10. A method for organizing a memory array layout in an integrated circuit device comprising:
    partitioning said memory array into a plurality of blocks of sub-arrays, at least one of said plurality of blocks of sub-arrays being topologically non-uniform with respect to others of said plurality of blocks of sub-arrays; and
    arranging said plurality of blocks of sub-arrays such that date bit locations assigned to respective ones of said blocks of sub-arrays are substantially proximate to corresponding input/output lines of said memory array.

11. The method of claim 10 wherein said at least one of said plurality of blocks of sub-arrays is of lesser topological area than said others of said plurality of blocks of sub-arrays.

12. The method of claim 10 further comprising:
    initially partitioning said memory array into a plurality of memory banks.

13. The method of claim 12 further comprising:
further partitioning said plurality of memory banks into said plurality of blocks of sub-arrays.

14. The method of claim 10 further comprising:
providing access to a first number subset of said plurality of blocks of sub-arrays through said input/output lines; and
further providing access to a second differing number subset of said plurality of blocks of sub-arrays through at least one other of said input/output lines.

15. An integrated circuit memory device comprising an array of memory cells formed into a plurality of memory banks, said device comprising:
at least one memory bank, said memory bank comprising at least one block of sub-arrays of said memory cells having a first on-chip area; and
at least one other memory bank comprising two or more additional blocks of sub-arrays of said memory cells, each of said additional blocks of sub-arrays having a lesser on-chip area than said first on-chip area.

16. The integrated circuit memory device of claim 15 wherein said at least one memory bank comprises a plurality of partial memory banks, each of said plurality of partial memory banks having said first on-chip area.

17. The integrated circuit memory device of claim 15 wherein said at least one other memory bank comprises a plurality of partial memory banks.

18. The integrated circuit memory device of claim 17 wherein at least one of said additional blocks of sub-arrays having a lesser on-chip area than said first on-chip area comprises memory cells of at least two other partial memory banks.

19. The integrated circuit memory device of claim 15 further comprising:
an input/output line associated with each data bit number designated for a sub-array block of said at least one memory bank and said at least one other memory bank.

20. The integrated circuit memory device of claim 19 wherein said input/output lines are in a topologically non-uniform arrangement with respect to said memory array.

21. The integrated circuit memory device of claim 19 wherein a subset of said input/output lines access a first number of said blocks and additional blocks of said sub-arrays and at least one other of said input/output lines access a second differing number of said blocks and additional blocks of said sub-arrays.

22. The integrated circuit memory device of claim 15 wherein said memory cells comprise dynamic random access memory cells.

* * * * *

UNITED STATES PATENT AND TRADEMARK OFFICE
CERTIFICATE OF CORRECTION

PATENT NO. : 6,741,488 B1
DATED : May 25, 2004
INVENTOR(S) : John Heightley and Jon Allan Faue It is certified that error appears in the above-identified patent and that said Letters Patent is hereby corrected as shown below:

Column 6,
Line 9, "ray" should be -- array --

Signed and Sealed this

Eighth Day of February, 2005

JON W. DUDAS
*Director of the United States Patent and Trademark Office*